United States Patent

Weng

[11] Patent Number: 5,949,653
[45] Date of Patent: Sep. 7, 1999

[54] STACKABLE CONTAINER ASSEMBLY FOR HOLDING ELECTRIC POWER SUPPLY UNITS

[75] Inventor: Hsien-Tang Weng, Taipei Hsien, Taiwan

[73] Assignee: Shin Jiuh Corporation, Taipei, Taiwan

[21] Appl. No.: 09/240,038

[22] Filed: Jan. 29, 1999

[51] Int. Cl.[6] .............................. H05K 5/02; H05K 7/00; H05K 7/14

[52] U.S. Cl. ...................... 361/735; 220/4.26; 220/23.6; 361/732; 361/747; 206/503; 206/509

[58] Field of Search .................................. 206/503, 508, 206/701, 706, 718, 724, 725, 509, 821; 220/4.21, 4.02, 4.24, 23.4, 4.26, 23.6, 4.27, 23.86; 248/27.1; 257/686, 685; 211/26, 41.1, 49.1, 50, 59.4; 307/150; 312/223.1, 107, 111, 108, 223.2, 308; 361/683, 685, 686, 735, 744, 731, 732, 747, 807, 809, 810, 825, 829; 439/74, 928, 928.1

[56] References Cited

U.S. PATENT DOCUMENTS

| | | | |
|---|---|---|---|
| 2,237,176 | 4/1941 | Dorman | 220/4.26 |
| 2,658,253 | 11/1953 | Richardson | 206/509 |
| 3,836,008 | 9/1974 | Mraz | 220/4.26 |
| 4,501,460 | 2/1985 | Sisler | 361/732 |
| 4,558,914 | 12/1985 | Prager et al. | 361/729 |
| 4,648,737 | 3/1987 | Lake, Jr. et al. | 361/732 |
| 5,251,106 | 10/1993 | Hui | 361/744 |
| 5,469,331 | 11/1995 | Conway et al. | 361/735 |
| 5,544,969 | 8/1996 | Ammon et al. | 361/744 |
| 5,577,613 | 11/1996 | Laidlaw | 206/509 |
| 5,602,721 | 2/1997 | Slade et al. | 361/724 |
| 5,630,658 | 5/1997 | Jeter | 312/107 |
| 5,697,500 | 12/1997 | Walker | 206/509 |

FOREIGN PATENT DOCUMENTS

| | | | |
|---|---|---|---|
| 3220056 | 12/1983 | Germany | 361/729 |
| 1568273 | 5/1990 | Russian Federation | 361/732 |

*Primary Examiner*—Donald Sparks
*Attorney, Agent, or Firm*—Fish & Richardson P.C.

[57] ABSTRACT

A stacked container assembly includes a variable number of stacked modular containers, and an engaging unit and a fastening unit provided on each container to permit the containers to connect with one another. The container assembly holds an electrical power supply assembly which includes a plurality of electrical power supply units respectively received inside the stacked containers, and an electrical control device electrically connected to the electrical power supply units and received inside a control box mounted on the top or bottom of the stacked containers.

15 Claims, 5 Drawing Sheets

STACKABLE CONTAINER ASSEMBLY FOR HOLDING ELECTRIC POWER SUPPLY UNITS

BACKGROUND OF THE INVENTION

1. Field of the Invention

This invention relates to a stackable container assembly having a plurality of stackable containers, more particularly to a stackable modular container assembly for holding a plurality of electric power supply units in a stack in such a manner that the electric power supply units are drawable inward or outward relative to the containers.

2. Description of the Related Art

Conventionally, electric power supply units are stored in a container, as illustrated in FIG. 1. The conventional container 11 has an integral housing with a plurality of storing chambers 10. Adjacent storing chambers 10 are partitioned by pairs of rails 100 mounted respectively on opposite side walls of the housing, and a bar plate transversely connected to the opposite side walls of the housing. An electrical power supply unit 12 is received inside each of the storing chambers 10 and is supported by the rails 100 so as to be slidable in and out of the storing chamber 10. The housing has screw holes 110 provided on each of the bar plates. Each electrical power supply unit 12 has a top and a bottom provided with an ear member 120 that projects therefrom and that has an ear hole so that the power supply unit 12 can be fastened to the bar plate, via screws extending through the screw holes and the ear holes, when the power supply unit 12 is placed inside the storing chamber 10.

Since the conventional container 11 is generally made as an integral body to store the power supply units 12, it lacks flexibility as the number of storing chambers 10 of the container 11 is unchangeable. Thus, when additional power supply units 12 are to be stored, there are not enough storing chambers 10 in the container 11. To change the number of storing chambers 10, it is necessary for manufacturers to re-design and re-dimension the container 11. As a result, the cost of manufacturing is increased, and the existing containers 11 will become useless.

SUMMARY OF THE INVENTION

Therefore, it is an object of the present invention to provide a stackable modular container assembly in which container modules can be assembled to a number corresponding to the number of electrical power supply units.

According to one aspect of the present invention, the stackable container assembly comprises: a plurality of containers, each of the containers including a pair of opposing side plates, a base plate disposed transversely of the side plates to connect one end of one of the side plates to one end of the other one of the side plates, and a pair of spaced apart opposing lips which are formed, respectively, on the other ends of the side plates opposite to the base plate and which project oppositely from the side plates, respectively; an engaging unit provided on each of the containers, the engaging unit including a pair of opposing ear pieces each projecting outwardly from one of the lips and the base plate, and a pair of engaging slits each formed in the other one of the lips and the base plate, the ear pieces of one of the containers being respectively engageable with the engaging slits of another one of the containers after the containers are stacked; and a fastening unit provided on each of the containers and including screw holes formed in the ear pieces and the side plates adjacent to the base plate, and screws for extending through the screw holes so as to fasten the ear pieces of one of the containers to the side plates of another one of the containers.

In another aspect of the present invention, a stacked electrical power supply assembly comprises: a plurality of containers disposed one over the other to form a stack, each of the containers including a pair of opposing side plates, a base plate disposed transversely of the side plates to connect one end of one of the side plates to one end of the other one of the side plates, and a pair of spaced apart opposing lips which are formed, respectively, on the other ends of the side plates opposite to the base plate and which project oppositely from the side plates, respectively; an engaging unit provided on each of the containers, the engaging unit including a pair of opposing ear pieces each projecting outwardly from one of the lips and the base plate, and a pair of engaging slits each formed in the other one of the lips and the base plate, the ear pieces of one of the containers respectively engaging the engaging slits of another one of the containers; a fastening unit provided on each of the containers and including screw holes formed in the ear pieces and the side plates adjacent to the base plate, and screws for extending through the screw holes so as to fasten the ear pieces of one of the containers to the side plates of another one of the containers; and a plurality of electrical power supply units disposed in the containers, respectively.

BRIEF DESCRIPTION OF THE DRAWINGS

In drawings which illustrate preferred embodiments of the invention.

DETAILED DESCRIPTION OF THE PREFERRED EMBODIMENTS

Figure 2:
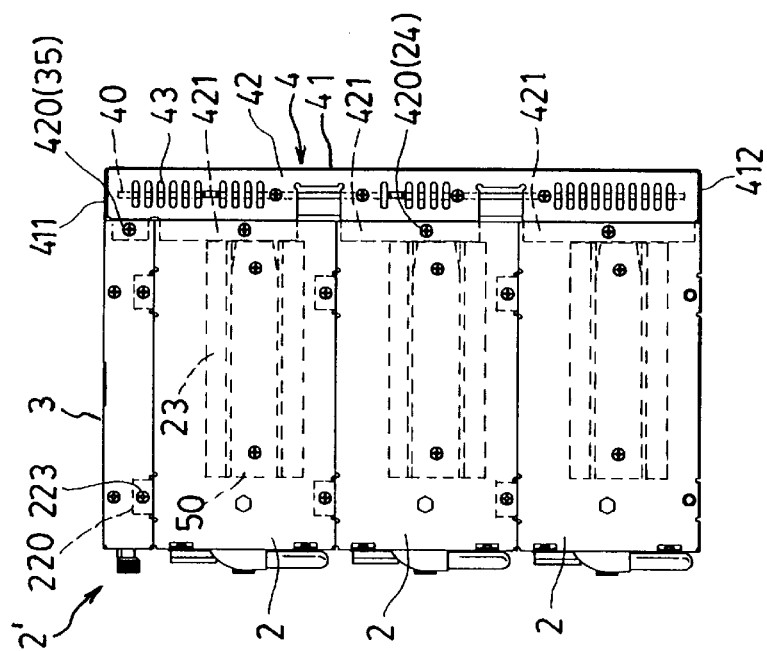
FIG. 2 is a side view of a stacked electrical power supply assembly embodying the present invention.
Figure 3:
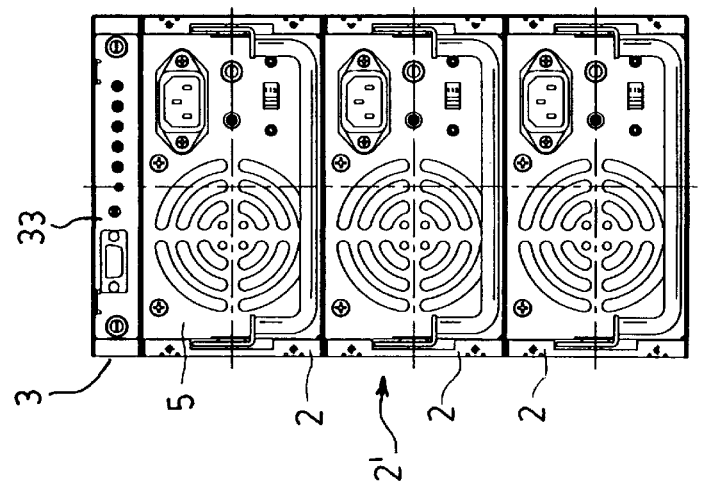
FIG. 3 is a front view of the stacked electrical power supply assembly of FIG. 2.
Figure 4:
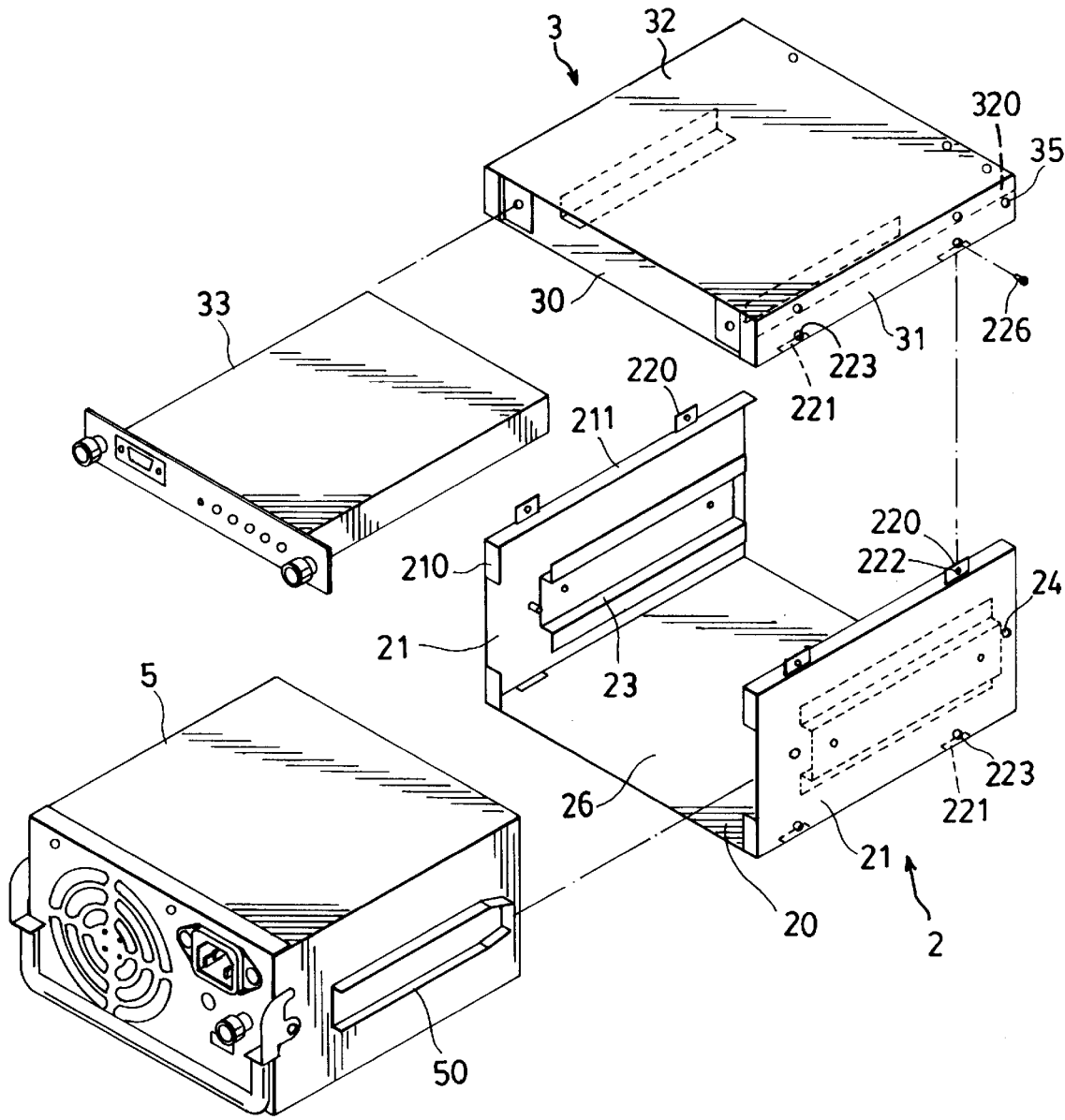
FIG. 4 is an exploded view showing one of the stacked containers, a control box, a power supply unit, and an electrical control device of the stacked electrical power supply assembly of FIG. 2.
Figure 9:
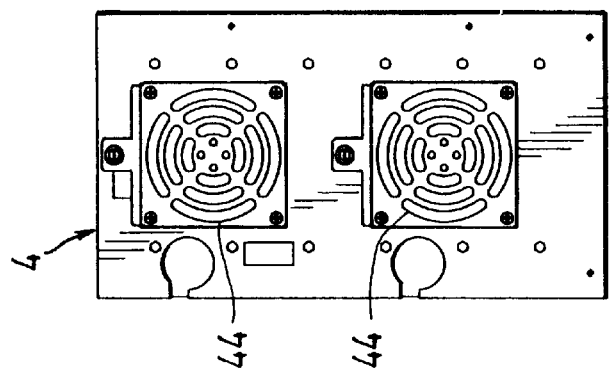
FIG. 9 shows a rear cover of the stacked electrical power supply assembly of FIG. 6.
Figure 6:
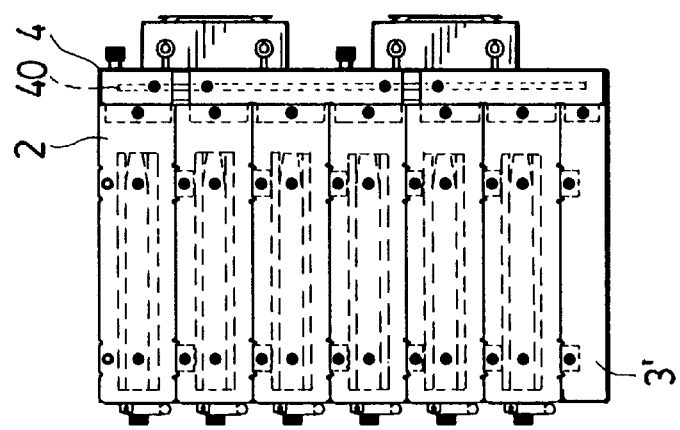
FIG. 6 is a side view of another embodiment of a stacked electrical power supply assembly of the present invention.
Figure 7:
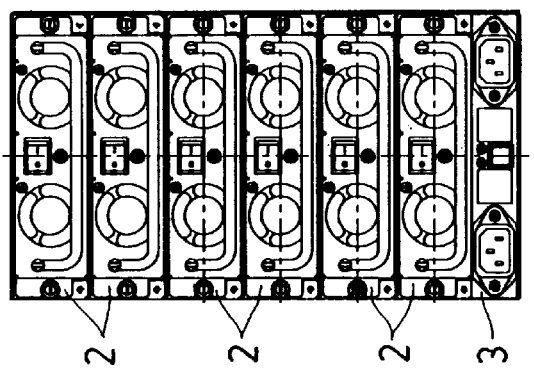
FIG. 7 is a front view of the stacked electrical power supply assembly of FIG. 6.
Figure 8:
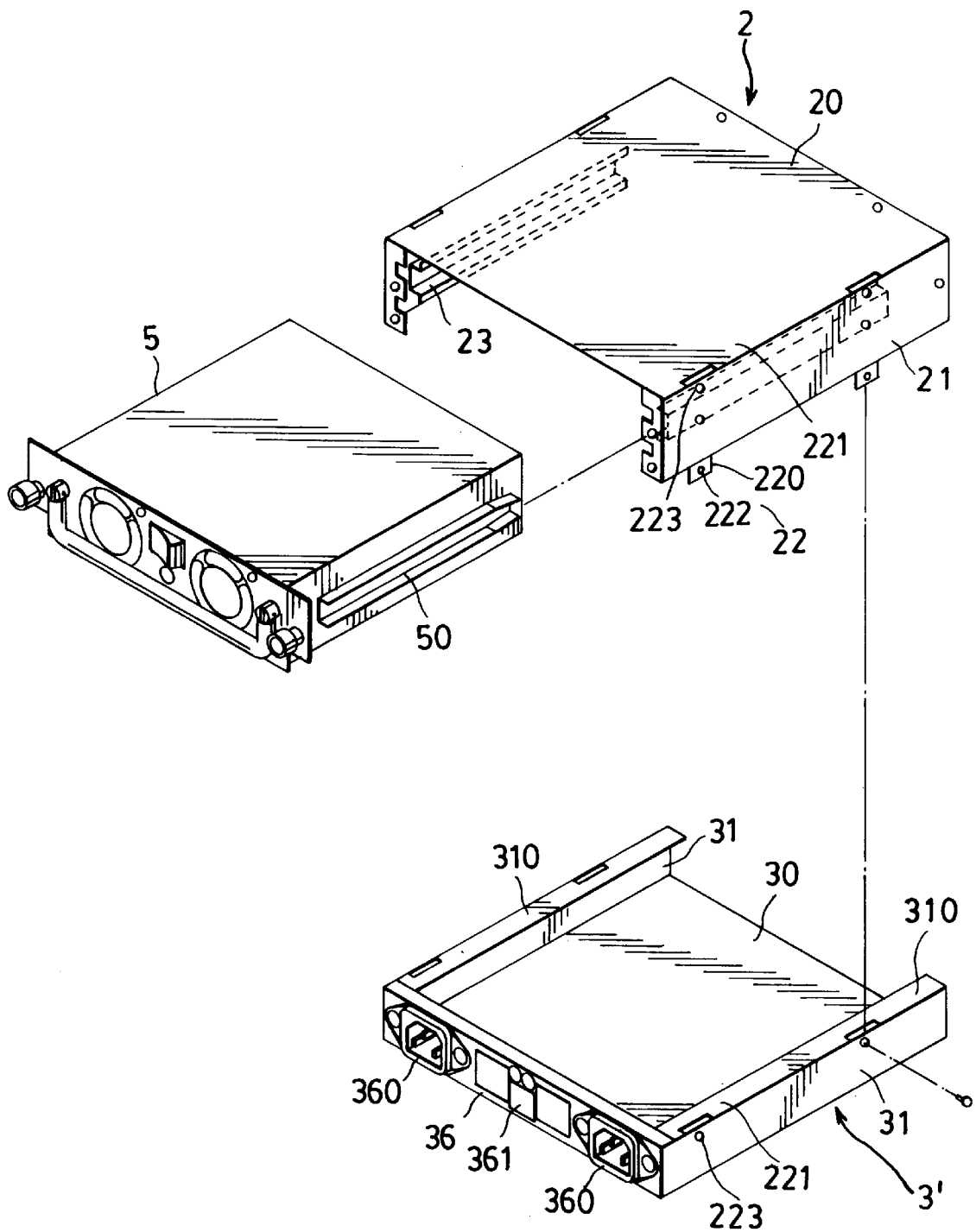
FIG. 8 is an exploded view of one of the stacked containers, a control box, and a power supply unit of the stacked electrical power supply assembly of FIG. 6.

FIGS. 2 to 4 show an electrical power supply assembly 2' embodying the present invention. The electrical power supply assembly 2' includes a plurality of containers 2 stacked one above the other, a control box 3 disposed on top of the stacked containers 2, and a rear cover 4 extending from the top of the control box 3 to the bottom of the stacked containers 2.

As illustrated in FIG. 4, each of the stacked containers 2 is formed from a bent plate which includes a base plate 20, and two opposite side plates 21 folded upward from two opposite sides of the base plate 20 to form a U-shape. A receiving space 26 is confined by the base plate 20 and the two side plates 21 for receiving a power supply unit 5. A pair of opposite rails 23 are attached respectively to the two opposite side plates 21, and a pair of opposite slide members 50 are provided on two opposite sides of the power supply unit 5 so as to slidably engage the rails 23, respectively, to permit drawing of the power supply unit 5 from the container 2. Each of the two opposite side plates 21 has one side provided with a pair of opposite right-angled side flanges 210, and a top side provided with a right-angled lip 211.

Figure 1:
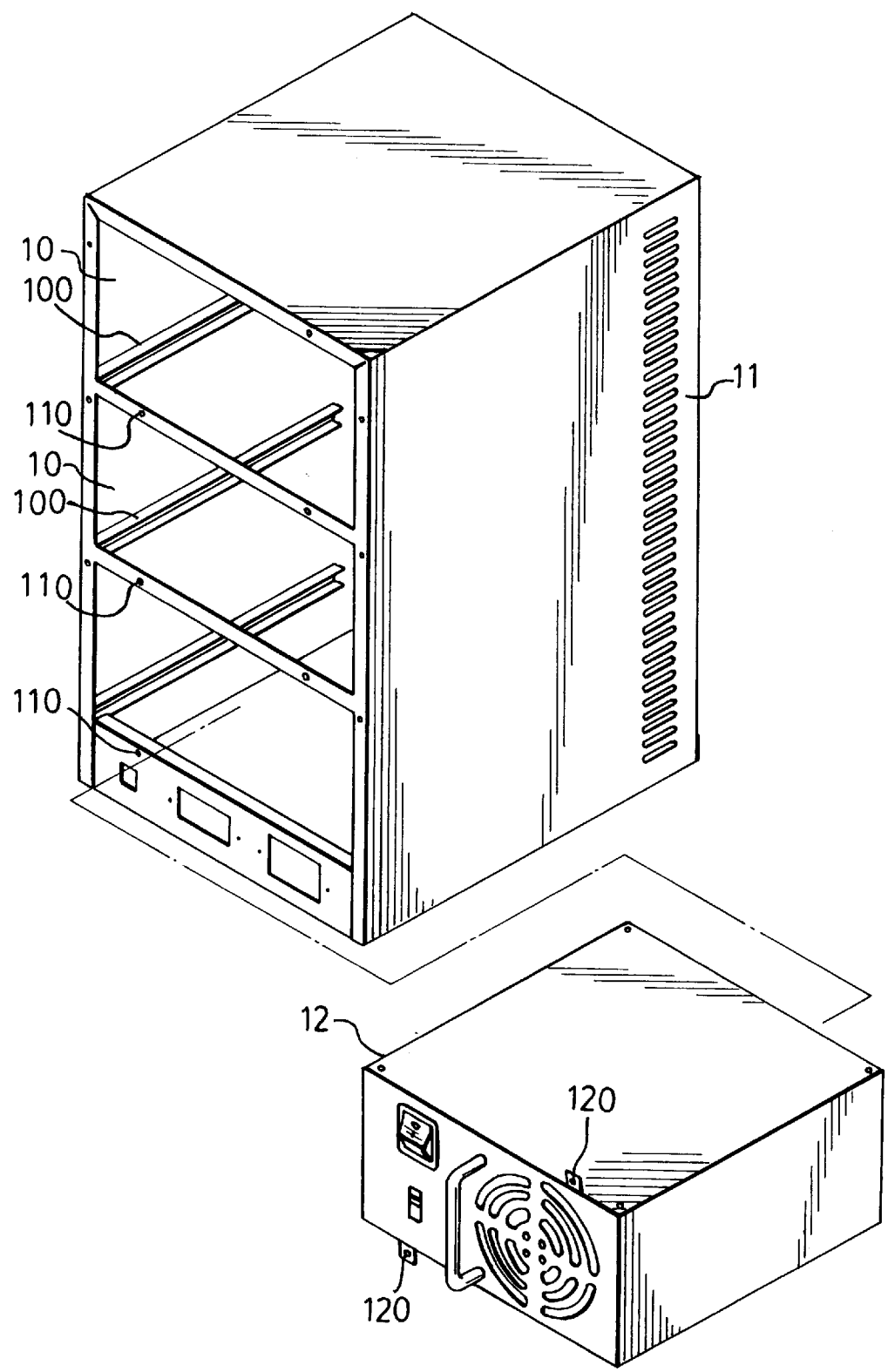
FIG. 1 is a perspective view of a conventional container and an electrical power supply unit.
Figure 5:
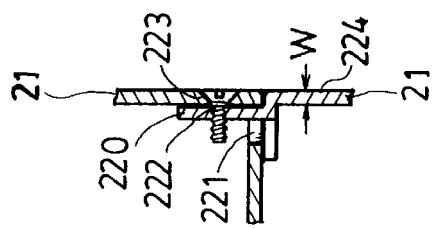
FIG. 5 shows a detailed connection between each ear piece and adjacent side plate of the stacked electrical power supply assembly of FIG. 2.

Each of the stacked containers 2 includes an engaging unit (see FIG. 5) and a fastening unit so that the stacked containers 2 can be interconnected together to form the electrical power supply assembly 2'. The engaging unit includes two pairs of ear pieces 220 and two pairs of engaging slits 221. The ear pieces 220 in each pair are disposed on the two opposite lips 211, respectively. The engaging slits 221 in each pair are provided in the base plate 20 adjacent to the side plates 21, respectively. Each of the ear pieces 220 of one of the stacked containers 2 engages the corresponding one of the engaging slits 221 of another one of the stacked containers 2. The fastening unit includes first and second screw holes 222, 223 formed respectively in the ear pieces 220 and the side plates 21 adjacent to the engaging slits 221, and screws 226 (only one is shown) for extending through the first and second screw holes 222, 223 so as to fasten the ear pieces 220 of one of the stacked containers 2 to the side plates 21 of another one of the stacked containers 2. Each of the ear pieces 220 projects upward from the corresponding lip 211 inwardly of the outer surface 224 of the adjacent side plate 21, and forms an offset (W) equal to a wall thickness of the side plate 21 so that the side plates of the stacked containers 2 are flush with one another (see FIG. 5).

As illustrated in FIG. 4, a control box 3 includes a base plate 30, a top plate 32, and two opposite upstanding side plates 31 formed by bending upward two opposing ends of the base plate 30. Side flanges 320 extend downward from two opposite sides of the top plate 32 and are secured to the two opposite side plates 31, respectively, by screw means. An electrical control device 33, such as an electrical power distributor, is received inside the control box 3 and is electrically connected to each power supply unit 5 for controlling of each power supply unit 5.

The control box 3 also has engaging slits 221 provided in the base plate 30, and screw holes 223 provided in the side plates 31 adjacent to the base plate 30. The control box 3 is secured on the topmost stacked container 2 by extending ear pieces 220 of the topmost stacked container 2 into the engaging slits 221 of the control box 3 and by inserting the screws 226 through the screw holes 223 of the control box 3 and the screws holes 222 of the topmost stacked container 2, respectively.

As illustrated in FIG. 2, the rear cover 4 includes a base plate 41, top and bottom plates 411, 412, and two opposing side panels 42 extending forwardly from the base plate 41. The side panels 42 are provided with connecting flanges 421 having screw holes 420 for allowing the cover 4 to be mounted respectively on the control box 3 and the stacked containers 2. Screws (not labeled) extend through the screw holes 420 of the rear cover 4 into the screws holes 24 of the stacked containers 2 and the screw holes 35 of the control box 3, respectively.

A circuit board 40 is electrically connected to the electrical control device 33 and is mounted inside the rear cover 4. A plurality of ventilation openings 43 are provided in the rear cover 4 for cooling the electrical power supply assembly 2'.

With the construction as described above, the electrical power supply assembly 2' permits an increase or decrease in the number of the stacked containers 2 so as to receive a desired number of power supply units 5.

FIGS. 6 to 9 illustrate another embodiment of the stacked containers 2 of the present invention, wherein reference numerals which are similar to those used in the previous embodiment represent like elements. This embodiment is substantially similar to the previous embodiment except that the stacked containers 2 are inversely stacked one over the other and a control box 3' is placed at the bottom of the stacked containers 2. The control box 3' differs from the control box 3 in that the control box 3' has a front plate 36 and lips 310 instead of the top plate 32. The control box 3' further includes electrical receptacles 360 and switches member 361 which are electrically connected to the circuit board 40. The cover 4 additionally contains two cooling fans 44 installed thereon for cooling the electrical power supply units 5.

With the invention thus explained, it is apparent that various modifications and variations can be made without departing from the spirit of the present invention. It is therefore intended that the invention be limited only as recited in the appended claims.

I claim:

1. A stackable container assembly, comprising:

a plurality of containers, each of said containers including a pair of opposing side plates, a base plate disposed transversely of said side plates to connect one end of one of said side plates to one end of the other one of said side plates, and a pair of spaced apart opposing lips which are formed, respectively, on the other ends of said side plates opposite to said base plate and which project oppositely from said side plates, respectively;

an engaging unit provided on each of said containers, said engaging unit including a pair of opposing ear pieces each projecting outwardly from one of said lips and said base plate, and a pair of engaging slits each formed in the other one of said lips and said base plate, said ear pieces of one of said containers being engageable with said engaging slits of another one of said containers, respectively, after said containers are stacked; and a fastening unit provided on each of said containers and including screw holes formed in said ear pieces and said side plates adjacent to said base plate, and screws for extending through said screw holes so as to fasten said ear pieces of one of said containers to said side plates of another one of said containers.

2. The stackable container assembly as claimed in claim 1, further comprising a pair of rails formed inside each of said containers and projecting from said side plates, respectively.

3. The stackable container assembly as claimed in claim 1, wherein said ear pieces project outwardly from said lips, respectively, in the direction of said side plates, said engaging slits being formed in said base plate adjacent to said side plates, respectively, said screw holes being formed in said side plates adjacent to said engaging slits.

4. The stackable container assembly as claimed in claim 3, wherein each of said ear pieces projects from the corresponding one of said lips inwardly of an outer surface of the adjacent one of said side plates and is offset from said outer surface by a distance equal to a wall thickness of said plates.

5. The stackable container assembly as claimed in claim 1, further comprising a rear cover mounted on said containers after said containers are disposed one above the other to form a stack, said rear cover extending from top to bottom of said stack and interconnecting said side plates of said containers.

6. A stacked electrical power supply assembly, comprising:

a plurality of containers disposed one over the other to form a stack, each of said containers including a pair of opposing side plates, a base plate disposed transversely of said side plates to connect one end of one of said side plates to one end of the other one of said side plates, and a pair of spaced apart opposing lips which are formed, respectively, on the other ends of said side plates opposite to said base plate and which project oppositely from said side plates, respectively;

an engaging unit provided on each of said containers, said engaging unit including a pair of opposing ear pieces each projecting outwardly from one of said lips and said base plate, and a pair of engaging slits each formed in the other one of said lips and said base plate, said ear pieces of one of said containers engaging said engaging slits of another one of said containers;

fastening unit provided on each of said containers and including screw holes formed in said ear pieces and said side plates adjacent to said base plate, and screws for extending through said screw holes so as to fasten said ear pieces of one of said containers to said side plates of the other one of said containers; and a plurality of electrical power supply units disposed in said containers, respectively.

7. The stacked electrical power supply assembly as claimed in claim 6, further comprising a pair of rails formed inside each of said containers and projecting oppositely from said side plates, respectively, each of said electrical power supply units having two opposite sides formed with slide members which project outwardly to slidably engage said rails, respectively.

8. The stacked electrical power supply assembly as claimed in claim 7, wherein said ear pieces project outwardly from said lips, respectively, in the direction of said side plates, said engaging slits being formed in said base plate adjacent to said side plates, respectively, said screw holes being formed in said side plates adjacent to said engaging slits.

9. The stacked electrical power supply assembly as claimed in claim 8, further comprising a rear cover mounted on said stack of said containers, said cover extending from top to bottom of said stack and interconnecting said side plates of said containers, said cover having a plurality of ventilation openings formed therein.

10. The stacked electrical power supply assembly as claimed in claim 9, further comprising a circuit board mounted on said rear cover, said electrical power supply units being electrically connected to said circuit board.

11. The stacked electrical power supply assembly as claimed in claim 10, further comprising a control box mounted on said stack, and an electrical control device received inside said control box and electrically connected to said power supply units and said circuit board.

12. The stacked electrical power supply assembly as claimed in claim 11, wherein said electrical control device and said control box are mounted at a top of said stack.

13. The stacked electrical power supply assembly as claimed in claim 11, wherein said electrical control device and said control box are mounted at a bottom of said stack.

14. The stacked electrical power supply assembly as claimed in claim 11, wherein said electrical control device comprises an electrical power distributor.

15. The electrical power supply assembly as claimed in claim 11, wherein said electrical control device comprises an electrical receptacle and a switch.

* * * * *